Dec. 1, 1959 J. T. MAUPIN 2,915,602

TETRODE TRANSISTOR AMPLIFIER

Filed Nov. 29, 1957 2 Sheets-Sheet 1

INVENTOR.
JOSEPH T. MAUPIN
BY Osmund R. Dahl
ATTORNEY

Dec. 1, 1959 J. T. MAUPIN 2,915,602
TETRODE TRANSISTOR AMPLIFIER
Filed Nov. 29, 1957 2 Sheets-Sheet 2

INVENTOR.
JOSEPH T. MAUPIN
BY Omund R. Dahle
ATTORNEY

United States Patent Office 2,915,602

Patented Dec. 1, 1959

2,915,602

TETRODE TRANSISTOR AMPLIFIER

Joseph T. Maupin, Deephaven, Minn., assignor to Minneapolis-Honeywell Regulator Company, Minneapolis, Minn., a corporation of Delaware Application November 29, 1957, Serial No. 699,827

13 Claims. (Cl. 179—171)

This invention relates to improvements in transistor circuitry in order to increase the linearity of the transfer function characteristics for large signals, and is more specifically concerned with such control of junction type tetrode high power transistors having two connections to the base area on opposite sides of the emitter junction.

An object of this invention is to provide new and novel circuit apparatus for improving the linearity of the transfer function of a junction type tetrode power transistor.

Another object of this invention is to provide a new and novel direct coupled class A transistor power amplifier circuit having improved linearity for large signals.

A further object of this invention is to provide a low distortion transistor amplifier circuit which can be operated from a high impedance signal source without input transformer drive.

Figures 1, 2, 3, 4:
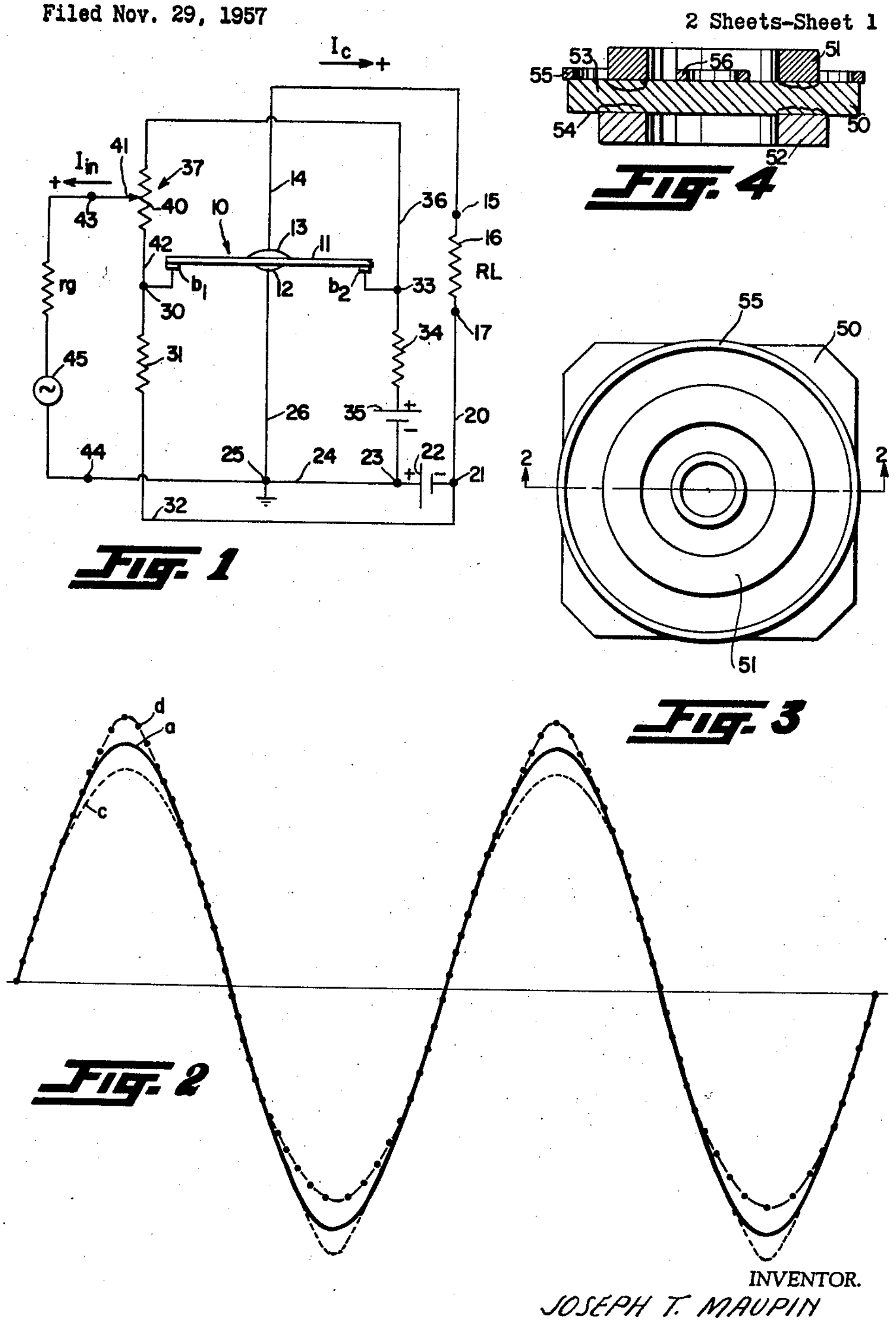
Figure 5A:
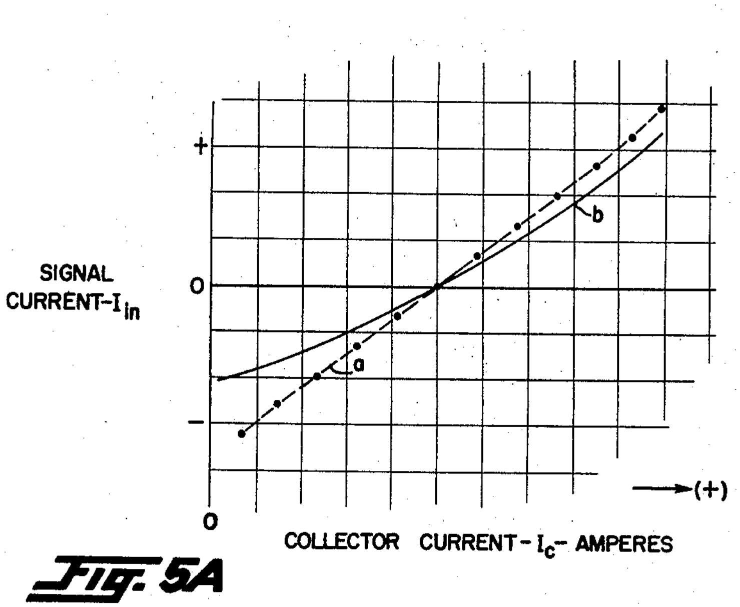
Figure 5B:
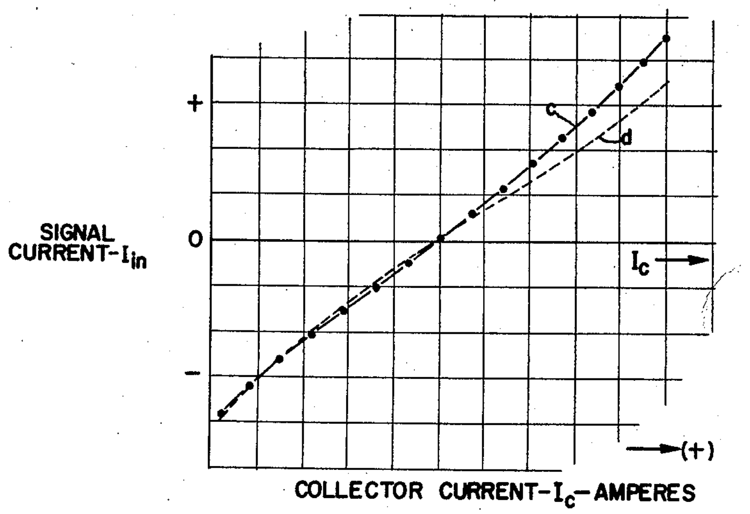

These and other objects of the invention will be understood upon consideration of the accompanying specification, claims and drawings of which:

Figure 1 is a schematic representation of a circuit which is an embodiment of the invention, Figure 2 is a graphical representation of the collector current wave form under various operating conditions, Figures 3 and 4 disclose the construction of a preferred type of transistor for use in this invention, Figure 3 being a top plan view of the device, and Figure 4 being a vertical sectional view taken along the lines and in the direction of the arrows 2—2 of Figure 3, and Figures 5A and 5B are graphical representations of transistor operating characteristics under various operating conditions.

Referring now to Figure 1, there is disclosed a junction type tetrode transistor 10, which may be of the diffused junction type, preferably of the general type shown in the co-pending application entitled "Semiconductor Devices," Serial No. 556,210, filed December 29, 1955 and assigned to the same assignee as the present invention. Figures 3 and 4 disclose an embodiment of the transistor device of the co-pending application. As can be seen by reference to these figures, the collector and emitter junctions are annular in form, and the base connections *b1* and *b2* are likewise annular, base connection *b1* being located around the emitter and base connection *b2* being located within the emitter annulus.

Referring again to Figure 1, the transistor 10 includes the wafer of semi-conductive material 11 which has two low resistance base electrode connections *b1* and *b2* attached thereto. The transistor also has an emitter electrode 12 and a collector electrode 13. It will be noted that the base connections *b1* and *b2* are so positioned on the base 11 that the emitter and collector junctions are positioned between them. A resistive current path exists between the two base connections with the majority of the base resistance being in the bridge area between the collector and emitter junctions.

The collector electrode 13 is connected by a conductor 14 to the upper terminal 15 of a load impedance 16. A lower terminal 17 of the load impedance 16 is connected by a conductor 20 and a junction 21 to the negative terminal of a power source 22, here shown as a battery. The positive terminal of the battery 22 is connected by a junction 23 to a ground conductor 24. The emitter electrode 12 is connected by a conductor 26 to a junction 25 on the ground conductor 24. The base connection *b1* is connected by means of a junction 30, a bias resistor 31 and a conductor 32 to the negative terminal of the battery 22 at the junction 21. The base *b2* is connected by means of a junction 33, and a resistor 34 to the positive terminal of a bias source 35, here shown as a battery. The negative terminal of the bias battery 35 is connected to the junction 23 on the ground conductor 24. The base connection *b2* is also connected by means of the junction 33, and a conductor 36 to the upper terminal of a potentiometer 37. The potentiometer 37 has an impedance element 40 and an adjustable wiper 41 in contact therewith. The lower terminal of the potentiometer 37 is connected by a conductor 42 and the junction 30 to the base connection *b1*. The potentiometer wiper 41 is connected by an input terminal 43 to the upper terminal of a signal source 45. The lower terminal of the signal source 45 is connected to a terminal 44 on the ground conductor 24. The signal source 45 is shown as having in series therewith the impedance of the source $r_g$.

Referring now to Figures 3 and 4 there is shown a modification of a transistor device which is particularly applicable to the present invention. The transistor of Figures 3 and 4 includes a semiconductor body or wafer 50 which has a pair of rectifying junction electrodes 51 and 52 situated in concentrically disposed relationship on a pair of parallelly disposed surfaces 53 and 54 respectively. The rectifying junction electrode 51 is the emitter electrode and is situated between a pair of ohmic contact base electrodes 55 and 56. The emitter electrode is preferably somewhat smaller in width dimension than is the corresponding collector electrode 52. The details of this device are more clearly set forth in the co-pending application, above referenced. It will be appreciated that transistor tetrode 10 of Figure 1 may represent a partial view, i.e. the right or left half of the transistor of Figures 3 and 4.

In considering the operation of the circuit of Figure 1 it will be noted that the source 22 provides the main source of power to eneregize the load device 16. The load has been shown as being resistive in nature but other load apparatus such as a transformer coupled load may be utilized if desired. A current path for energizing the load may be traced from the positive terminal of the source 22 through ground conductor 24 to junction 25, through conductor 26 to emitter electrode 12, and through the transistor from emitter to collector, conductor 14 to the load 16, from the lower terminal of the load through conductor 20 and junction 21 to the negative terminal of the source 22.

The tetrode transistor 10 operates as an amplifier to control the current flowing in the load circuit as a function of an input signal. It can be seen that the transistor 10 is connected in the common emitter configuration, that is, the emitter being a common electrode to both the input and the output circuits of the transistor. The discussion below will be considered principally on the basis of a linear current amplifier, that is, where the source is a relatively high impedance or current source, and where the current transfer characteristics of the tetrode transistor are considered so that a circuit is provided which can energize a load device with a current which is a faithful reproduction of the signal current.

Prior to considering the operation of the present circuit the operation of several variations of the circuit will be considered. The transistor can be operated as a triode by omitting the bias source 35, the resistor 34 and the connection 36 from the circuit of Figure 1, thus leaving the base connection $b2$ open. The current transfer characteristic of the triode is not linear, however, so that a relatively large harmonic distortion results in the load device. The current transfer characteristic curve for triode operation is shown in Figure 5A, curve $b$, where it can be seen that the graph of the current transfer characteristic, or in other words, the plot of signal current ($Iin$) vs. collector current ($Ic$) is not a linear relationship but appears continuously curved. The slope of the current transfer characteristic at a given point is the small signal A.C. gain at the same point. In the case of curve $b$ the transistor, as a triode, was biased to a quiescent collector current of 1.25 amperes and the collector current swing was approximately 2 amperes peak-to-peak. The harmonic distortion in the case of the triode operation was in excess of 10%. In any circuit, it is possible to reduce distortion to some extent by various negative feedback arrangements. A more fundamental approach is to correct the distortion at its source, namely, by controlling the device gain characteristics.

Previous investigation has shown that significant improvement in the linearity of the current transfer characteristic of high power tetrode transistors can be realized by various methods of transverse base biasing. An example of one such circuit is shown in the co-pending application of Marshall et al. entitled "Transistor Circuit," Serial No. 572,983, filed March 21, 1956, and assigned to the same assignee as the present invention. Referring again to Figure 1, it can be seen that the bias battery 35, and the resistor 34 in series therewith, provide a transverse bias across the transistor base semiconductor wafer from the base connection $b2$ to the base connection $b1$. It will be further noted that the battery 35 provides a reverse bias on the emitter-base junction, especially the area of the emitter junction which is adjacent to base connection $b2$. The reverse potential across the junction is a potential in a direction which is opposite to the direction of easy current flow of the emitter-base rectifying junction. This reverse potential is in a direction to tend to maintain the transistor cut off. The base electrode $b1$, on the other hand, is connected to a negative potential point with respect to the emitter electrode. This connection can be traced from the base connection $b1$ through the resistor 31 and the conductor 32 to the negative terminal of battery 22. This biasing circuit is in a direction to tend to turn the transistor on, and by a proper choice of the magnitude of resistor 31 and 34 and the battery 22 and 35, the transistor can be biased into a desired state of conduction under quiescent conditions.

Investigation of the circuit of this nature in which the signal is connected directly to the base electrode $b1$ shows this circuit does result in a much more linear current transfer characteristic than is available from triode operation with the same transistor, however, the performance of this circuit still falls short of high quality audio performance. Curve $c$ of Figure 5B represents the current transfer characteristic of the tetrode circuit with the back bias on base $b2$ and the forward bias and signal applied to base $b1$. It will be noted that the curve is still concave upward but to a much smaller extent than is the triode curve in Figure 5A. The distortion in the circuit above discussed is primarily second harmonic, because of the reduction in gain as the collector current swings above the quiescent operating point. Figure 2 shows in graphical form various collector current wave forms resulting with sine wave input signals applied. An exaggerated representation of the distorted wave form of the collector current of the circuit above described is shown in curve $c$ of Figure 2.

In the circuit of Figure 1, the input signal may be connected directly to the base electrode $b2$. The value of the resistance 34 should be large with respect to the transistor input impedance at electrode $b2$. Again the quiescent biasing conditions are such that a transverse current is flowing through the transistor base wafer from base electrode $b2$ to electrode $B^1$. The forward bias of base electrode $b1$ is again chosen so that the base current flowing out of base electrode $b1$ is larger than the transverse current flowing into the base electrode $b2$, so that emitter current is flowing and the transistor is biased into a conductive region. This transverse bias has reduced the current gain of the transistor and when an alternating current input, applied to base electrode $b2$, swings in a negative going direction, the transverse bias potential is partly nullified, the transverse current $Ib2$ decreases, and the transverse current $Ib1$ flowing out of electrode $b1$, which is a relatively constant current, is sufficient to drive the collector current $Ic$ far above the quiescent value. Since with this instantaneous polarity of signal the circuit is being shifted towards a condition of triode operation that is, where the transverse current $Ib2$ equals zero, the current gain of the transistor is actually increasing as the collector current $Ic$ swings above the quiescent point.

On the other hand, as the input signal swings positive, the transverse bias potential at the base electrode $b2$ is increased so that the current flowing into the base electrode $b2$ is increased, with the result that the collector current $Ic$ falls below the quiescent point. To reduce the collector current $Ic$ to cutoff, the transverse current $Ib2$ must be increased to equal or slightly exceed the transverse current $Ib1$. The dynamic or A.C. current gain of the transistor as seen at base electrode $b2$ is therefore lower for downward excursions of collector current than it is for upward excursions. This is clearly shown in curve $d$ of Figure 5B in which it will be noted that the curve is slightly concave downward. An exaggerated version of the wave shape of collector current resulting from an alternating current sine wave signal applied at base electrode $b2$ is shown as curve $d$ of Figure 2.

The curves $c$ and $d$ of Figure 5B and curves $c$ and $d$ of Figure 2 show clearly that the distortion of these curves is substantially inverse to one another. Curve $c$ of Figure 5B is concave upward and curve $d$ is concave downward. Also in Figure 2 curve $c$ the positive peaks are flattened and the negative peaks extended whereas in curve $d$ the negative peaks are flattened.

Considering again the operation of the circuit of the present invention, as shown in Figure 1, let it be assumed that the back bias applied to base electrode $b2$ and the forward bias applied to base electrode $b1$ are so adjusted that the transistor is biased into a class A operation condition. An example of this is shown in Figure 5A, curve $a$, where the quiescent collector current of the transistor is shown as 1.25 amperes with signal currents large enough to cause a two-ampere peak-to-peak collector current swing. Under these conditions the base current $Ib1$ flowing out of base electrode $b1$ is greater than the base current $Ib2$ flowing into the base electrode $b2$, so that emitter current is flowing in the transistor and the transistor is biased to a conductive state. The alternating current signal from signal source 45 is applied between the emitter and the adjustable wiper 41 of the potentiometer 47 to a point of the resistance element 40 intermediate to the upper and lower terminals. Under these operating conditions the signal is applied simultaneously to both base electrodes $b1$ and $b2$, the magnitude of the signal to each base electrode being approximately a function of the ratio of the resistance in the upper and lower arms of the potentiometer winding 40.

Assuming that the instantaneous polarity of the signal applied to each base is positive, it will be apparent that this signal applied through the upper portion of the resistance 40 to the base electrode *b*2 is of the polarity to increase the base current I*b*2 flowing into the base electrode *b*2. This signal is in a direction to tend to increase the reverse bias between the base and the emitter 12 to reduce the collector current flowing in the transistor. This positive potential is also applied through the lower portion of the resistance 40 to the base electrode *b*1, and this signal is in a direction to reduce the base current I*b*1 flowing out of the base electrode *b*1 whereby the collector current flowing in the transistor is again reduced. As the instantaneous polarity of the signal reverses, the opposite effect is true in each of the base connections. Since the signal is divided and the same instantaneous polarity of signal is applied to both bases simultaneously, the distortion introduced by feeding the signal in at one base and the substantially opposite or reverse distortion introduced at the other base tend to cancel resulting in an output wave form which is a more exact reproduction of the signal wave form. By a proper adjustment of the potentiometer wiper 41 the optimum point can be reached where a very marked improvement in linearity of the current transfer characteristic results and a significant improvement in reduction of total harmonic distortion is realized. Curve *a* of Figure 5A, when considered with curve *b* or with curve *c* of Figure 5B shows graphically the marked improvement in the linearity of the current transfer function of the circuit of this invention. Curve *a* of Figure 2 also shows the improved collector current waveform resulting from this invention.

Many changes and modifications of this invention will undoubtedly occur to those who are skilled in the art and I therefore wish it to be understood that I intend to be limited by the scope of the appended claims and not by the specific embodiment of the invention which is disclosed herein for the purpose of illustration only.

I claim:

1. In tetrode semiconductor amplifying apparatus having a pair of signal input circuits, each of which introduces a particular nonlinearity of amplification substantially opposite in character from the other, a circuit comprising: tetrode semiconductor amplifier means having a semiconductive body and a plurality of electrodes attached thereto including a collector electrode, an emitter electrode and first and second base electrodes; means connecting said emitter electrode to a reference potential point; load means; first potential source means; output means comprising said load means and said potential means connected intermediate said collector electrode and said reference potential point; first means providing a first substantially constant current out of said first base electrode; second means providing a second substantially constant current into said second base electrode, said first and second substantially constant currents having opposite effects on the conductivity of said semiconductor, one tending to maintain said semiconductive means conductive and the other tending to maintain said semiconductor means non-conductive, said first and second means being adjusted so that said semiconductive means is maintained conductive; an impedance network having first and second terminals and an intermediate terminal, said first and second terminals being connected to said first and second base electrodes; a source of electrical signal having a first and a second terminal; and means connecting said signal source first terminal to said emitter electrode and said signal source second terminal to the intermediate terminal of said impedance network so that said signal is applied simultaneously to each of said base electrodes with respect to said emitter electrode whereby said signal is amplified and said nonlinearities tend to cancel out.

2. Semiconductor amplifying apparatus having low distortion and improved linearity comprising; tetrode semiconductor amplifier means having a pair of signal input circuits, each of which introduces a particular nonlinearity of amplification substantially opposite in character from the other, said means including semiconductive body and having a plurality of electrodes attached thereto including an emitter electrode, a first and a second control electrode, and a collector electrode; output means including electrical energizing means connected to said collector electrode; first bias means for producing a first substantially constant current, said first bias means being connected to cause said first constant current to flow into said first control electrode; second bias means for producing a second substantially constant current, said second bias means being connected to cause said second constant current to flow out of said second control electrode, said first bias means on said first control electrode tending to render said semiconductor amplifying means conductive, said second bias on said second control electrode tending to render said semiconductor amplifying means non-conductive, said first and second bias means being adjusted with respect to each other so that said semiconductive means is rendered conductive; impedance means connected between said first and second control electrodes, said impedance means having an intermediate connection; a source of alternating signal having a first and second terminal; and means connecting said first terminal to said intermediate connection and said second terminal to said emitter electrode so that said signal is simultaneously applied to both of said control electrodes with respect to said emitter electrode, whereby said signal is amplified and said nonlinearities tend to cancel.

3. In tetrode semiconductor amplifying apparatus having a pair of signal input circuits, each of which has a particular nonlinearity of application substantially opposite in character to the other, a circuit comprising: tetrode semiconductor amplifier means having a semiconductive body and a plurality of electrodes attached thereto including a collector electrode, an emitter electrode, and first and second control electrodes; means connecting said emitter electrode to a reference potential point; load means; a first source of power; output means comprising said load means and said first source connected intermediate said output electrode and said reference potential point; first means providing a first substantially constant current into said first control electrode, said first constant current tending to maintain said semiconductor means non-conductive; second means providing a second substantially constant current out of said second control element, said second constant current tending to maintain said semiconductive means conductive, said first and second means being adjusted so that said semiconductive means is maintained conductive; an impedance network having first and second terminals and an intermediate terminal, said first and second terminals being connected to said first and second control electrodes, respectively; a source of signal potential; and means connecting said signal source intermediate said emitter electrode and the intermediate terminal of said impedance network so that said signal is applied simultaneously to each of said control electrodes with respect to said emitter to modulate said constant currents and thereby control the output current of said semiconductor means, whereby said signal is amplified and said nonlinearities tend to cancel each other.

4. In tetrode semiconductor amplifying apparatus having a pair of signal input circuits, each of which has a particular nonlinearity of amplification substantially opposite in character to the other, a circuit comprising: tetrode semiconductor amplifier means having a semiconductive body and a plurality of elements attached thereto including an output electrode, a common electrode, and first and second control elements; means connecting said common electrode to a reference potential point; load means; first potential producing means; output means comprising said load means and said potential producing means connected intermediate said output electrode and said reference potential point; first means providing a reverse bias potential at said second control element with respect to said common electrode, said reverse bias potential tending to maintain said semiconductor means non-conductive; second means providing a forward bias potential at said first control element with respect to said common electrode, said forward bias potential tending to maintain said semiconductive means conductive, said first and second means being adjusted with respect to each other so that said semi-conductive means is maintained at least partially conductive; an impedance network having first and second terminals and an intermediate terminal, said first and second terminals being connected to said first and second control elements; a source of signal potential; and means connecting said signal source intermediate said common electrode and the intermediate terminal of said impedance network so that said signal is applied simultaneously to each of said control elements with respect to said common electrode whereby said nonlinearities tend to cancel and said signal is linearly amplified.

5. In tetrode semiconductor amplifying apparatus having a pair of signal input circuits, each of which has a particular nonlinearity of amplification substantially opposite in character from the other, a circuit comprising: semiconductor amplifier means having a semiconductive body and having a plurality of electrodes attached thereto including an output electrode, a first and a second control electrode, and a common electrode; output means including electrical energizing means connected to said output electrode; bias potential means connected to provide a forward bias on said first control electrode and a reverse bias on said second control electrode with respect to said common electrode; impedance means connected between said first and second control electrodes, said impedance means having an intermediate connection; a source of alternating signal having a first and second terminal; and means connecting said first terminal to said intermediate connection and said second terminal to said common electrode so that said signal is applied in the same phase to both of said control electrodes with respect to said common electrode whereby said nonlinearities tend to cancel and said signal is linearly amplified.

6. Semiconductor amplifying apparatus having low distortion and improved linearity comprising; tetrode semiconductor amplifier means having a pair of signal input circuits, each of which has a particular nonlinearity of amplification substantially opposite in character from the other, said means comprising a semiconductive body and having a plurality of electrodes attached thereto including an output electrode, a first and a second control electrode, and a common electrode; output means including electrical energizing means connected to said output electrode; bias potential means connected to provide a forward bias on said first control electrode and a reverse bias on said second control electrode with respect to said common electrode; said forward bias on said first control electrode tending to render said semiconductor amplifying means conductive, said reverse bias on said second control electrode tending to render said semiconductor amplifying means non-conductive, said forward and reverse bias potentials being adjusted so that said semiconductive means is rendered conductive; impedance means connected between said first and second control electrodes, said impedance means having an intermediate connection; a source of alternating signal having a first and second terminal; and means connecting said first terminal to said intermediate connection and said second terminal to said common electrode so that said signal is applied in the same phase to both control electrodes with respect to said common electrode whereby said nonlinearities tend to cancel and said signal is linearly amplified.

7. Semiconductor amplifying apparatus for alternating signals comprising: tetrode semiconductor amplifying means having a semiconductive body and having a plurality of electrodes attached thereto including an output electrode, first and second input electrodes, and an electrode common to said output and input electrodes; a source of power; output means including said source of power connected intermediate said output electrode and said common electrode; a first constant current source, said first constant current source being connected between said common electrode and said first input electrode and tending to cause a first constant current to flow into said input electrode, said first constant current being in a direction to tend to render said semiconductor non-conductive; a second constant current source, said second constant current source being connected between said common electrode and said second input electrode, said second constant current source being opposite in polarity from said first constant current source whereby a second relatively constant current is caused to flow out of said second input electrode, said second constant current being in a direction to render said semiconductor means conductive; a source of signal; first means connecting said signal source intermediate said first input electrode and said common electrode; second means connecting said signal source intermediate said second input electrode and said common electrode, the nonlinearity of the current transfer characteristic resulting from signals connected to both said first input and to said second input electrodes being substantially inverse of each other whereby the output wave shape is a more exact amplified reproduction of the signal wave shape.

8. Semiconductor amplifying apparatus for alternating signals comprising: tetrode semiconductor amplifying means having a semiconductive body and having a plurality of electrodes attached thereto including a collector electrode, an emitter electrode, and first and second base electrodes; a source of power; output means including said source of power connected intermediate said collector electrode and said emitter electrode; a first constant current source, said source being connected between said emitter electrode and said first base electrode and tending to cause a first constant current to flow into said base electrode, said current being in a direction to tend to render said semiconductor nonconductive; a second constant current source, said source being connected between said emitter electrode and said second base electrode, said second constant current source being opposite in character from said first constant current source whereby a second relatively constant current is caused to flow out of said second base electrode, said second constant current being in a direction to tend to render said semiconductor means conductive; a source of signal having one terminal connected to said emitter; first impedance means connecting the second terminal of said signal source to said first base electrode; second impedance means connecting the second terminal of said signal source to said second base electrode, the nonlinearity of the input-current vs. output-current transfer characteristics resulting from signals connected to said first base and to said second base electrodes being substantially inverse of each other and the nonlinearities tend to cancel whereby the output wave form is a more exact reproduction of the signal wave form.

9. In a tetrode semiconductor amplifying circuit having a pair of signal input circuits, each of which introduces a substantially opposite nonlinearity of amplification, a circuit comprising: tetrode semiconductor means having a semiconductive body and having a plurality of electrodes attached thereto including an output electrode, first and second input electrodes and an electrode common to said output and input electrodes, said input electrodes being in ohmic contact with said semiconductive body and being located on opposite sides of said common electrode, said output and common electrodes comprising output electrodes, said first input electrode and said common electrode comprising a first input circuit, said second input electrode and said common electrode comprising a second input circuit; output means including energizing means connected to said output electrodes; first and second constant current producing means; means connecting said first constant current producing means intermediate said first input electrode and said common electrode whereby a relatively constant current is caused to flow into said first input electrode; second means connecting second constant current producing means intermediate said second input electrode and said common electrode, said second constant current producing means being opposite in character whereby a relatively constant current is caused to flow out of said second input electrode; said first and second constant currents being of predetermined magnitudes such that said transistor is rendered conductive; a resistive network having first and second end terminals and an intermediate connection, said end terminals being connected to said first and second input electrodes, respectively; a source of signal potential; and means connecting said signal source to said intermediate connection and to said common electrode, whereby said signal is simultaneously applied to said first and second input circuits so that said nonlinearities are effectively cancelled out and the amplified output wave shape is a more exact reproduction of the signal wave shape.

10. In a tetrode transistor amplifying circuit having a pair of signal input circuits, each of which has a particular nonlinearity of amplification partially opposite in character from the other, a circuit comprising: tetrode transistor means having a semiconductive body and having a plurality of electrodes attached thereto including a collector electrode, an emitter electrode, and first and second base electrodes, said base electrodes being in ohmic contact with said semiconductive body and being located on opposite sides of said emitter electrode, said collector and emitter electrodes comprising output electrodes, said first base electrode and said emitter electrode comprising a first input circuit, said second base electrode and said emitter electrode comprising a second input circuit; output means including energizing means connected to said output electrodes; first and second constant current producing means; means connecting said first constant current producing means intermediate said first base electrode and said emitter electrode whereby relatively constant current is caused to flow into said first base electrode; second means connecting said second constant current producing means intermediate said second base electrode and said emitter electrode, said second constant current producing means being opposite in character whereby a relatively constant current is caused to flow out of said second base electrode; said first and second constant currents being of predetermined magnitudes such that said transistor is rendered conductive; a resistive network having first and second end terminals and an intermediate connection, said end terminals being connected to said first and second base electrodes, respectively; a source of signal potential; and means connecting said signal source to said intermediate connection and to said emitter electrode, whereby said signal is simultaneously applied to said first and second input circuits so that said nonlinearities are effectively eliminated.

11. Semiconductor amplifying apparatus comprising: tetrode transistor amplifying means having a semiconductive body and having a plurality of electrodes attached thereto including a collector electrode, an emitter electrode, and first and second signal input electrodes; first and second substantially constant current producing means, said first and second current producing means being opposite in direction, said first substantially constant current producing means being connected to said first signal input electrode and said second substantially constant current source being connected to said second signal input electrode whereby a substantially constant current flows into one of said signal electrodes and a second substantially constant current flows out of the other of said signal electrodes, each of said constant current sources also being connected to said emitter electrode; one of said signal electrodes having an input-output current transfer characteristic such that its slope tends to increase with increasing signal currents and the other of said signal electrodes having an input-output current transfer characteristic, the slope of which tends to decrease with increasing signal currents; impedance means connected between said first and second control electrodes, said impedance means having an intermediate connection; a source of alternating signal having a first and a second terminal; and means connecting said first terminal to said intermediate connection and said second terminal to said emitter electrode whereby said signal is simultaneously applied to both said first and second signal input electrodes with respect to said emitter electrode whereby said signal is amplified and said nonlinearities tend to cancel out.

12. Tetrode semiconductor amplifying apparatus for alternating signals having a pair of signal input circuits, each of which is subject to introducing a substantially opposite nonlinearity of amplification, a circuit comprising: tetrode transistor amplifying means having a semiconductive body and having a plurality of electrodes attached thereto including a collector electrode, an emitter electrode, and first and second base electrodes; a source of power having a first and a second terminal, said first terminal being connected to said emitter electrode; output means including said source of power connected intermediate said collector electrode and said emitter electrode; a bias potential source having a positive and a negative terminal; means connecting said negative terminal to said emitter electrode; impedance means connecting said positive terminal to said first base electrode, said bias being in a direction to tend to render said semiconductor nonconductive; impedance circuit means connecting said second base electrode to the second terminal of said source of power, said second base bias circuit being in a direction to tend to render said semiconductor means conductive; a source of signal having a first and a second terminal, said first terminal being connected to said emitter electrode; first impedance means connecting said signal source second terminal to said first base electrode; and second impedance means connecting said signal source second terminal to said second base electrode, said signal thus being simultaneously connected to both input circuits so that the nonlinearity of the slope of the current transfer characteristics of signals connected to said first and second base electrodes being substantially inverse of each other tend to cancel out whereby the output wave form is a more perfect replica of the signal wave form.

13. In tetrode semiconductor amplifying apparatus having a pair of signal input circuits, each of which introduces a particular nonlinearity of amplification substantially opposite in character from the other, a circuit comprising: tetrode transistor means having a plurality of electrodes including a collector electrode, an emitter electrode and first and second base electrodes; first bias means connected between said emitter and first base electrode tending to provide a reverse bias potential on the emitter-base junction; second bias means connected between said emitter and said second base electrode, said second bias means being opposite in character from the first and tending to provide a forward bias across the emitter-base junction so that a portion of the emitter junction is reverse biased; output circuit means having first and second terminals connected to said emitter and collector electrodes, respectively, said output circuit means including energizing means; a source of signal potential having first and second terminals, said first terminal being connected to said emitter electrode; and first and second impedance means connecting said second signal source terminal to said first and second base electrodes so that said signal is simultaneously applied to both base electrodes with respect to said emitter electrode whereby said signal is amplified and said nonlinearities tend to cancel each other.

References Cited in the file of this patent

UNITED STATES PATENTS

| | | |
|---|---|---|
| 2,695,930 | Wallace | Nov. 30, 1954 |

FOREIGN PATENTS

| | | |
|---|---|---|
| 764,260 | Great Britain | Dec. 19, 1956 |